United States Patent [19]
Bell et al.

[11] Patent Number: 4,495,078
[45] Date of Patent: Jan. 22, 1985

[54] SOLID PROTON CONDUCTORS AND THEIR USE

[75] Inventors: Michael Bell, Kingston, Canada; Klaus-Dieter Kreuer, Böblingen; Albrecht Rabenau; Werner Weppner, both of Stuttgart, all of Fed. Rep. of Germany

[73] Assignee: Max-Planck-Gesellschaft zur Foerderung der Wissenschaften e.V., Gottingen, Fed. Rep. of Germany

[21] Appl. No.: 396,953

[22] Filed: Jul. 9, 1982

[30] Foreign Application Priority Data

Jul. 14, 1981 [DE] Fed. Rep. of Germany ....... 3127821

[51] Int. Cl.$^3$ ............................ H01G 9/00; H01B 1/06
[52] U.S. Cl. .................................... 252/62.2; 252/518; 252/521

[58] Field of Search ...................... 252/62.2, 518, 521; 429/33, 192, 193; 284/295

[56] References Cited

U.S. PATENT DOCUMENTS

| | | | |
|---|---|---|---|
| 3,266,940 | 8/1966 | Caesar | 429/33 |
| 3,497,389 | 2/1970 | Berger | 429/33 |
| 4,206,088 | 6/1980 | Inoue | 252/62.2 |

*Primary Examiner*—John F. Niebling
*Attorney, Agent, or Firm*—Felfe & Lynch

[57] ABSTRACT

Solid proton conductors are described, which are based on zeolites having proton-containing cations and having six-member and larger rings as secondary structural groups of the zeolitic structure, and in whose crystal lattice passages a phase is present which promotes proton transport. Their use as separator material and electrolyte for electrochemical cells is also described.

12 Claims, No Drawings

SOLID PROTON CONDUCTORS AND THEIR USE

The invention concerns solid proton conductors and their use.

Proton-conducting solid materials have already become known, such as molybdatophosphoric acid and tungstatophosphoric acid ($H_3PW_{12}O_{40} \cdot nH_2O$), hydrogen uranyl phosphate ($NHO_2PO_4 \cdot 4H_2O$) and hydrous beta-aluminum oxide (W. A. England et al., Solid State Ionics 1 (1980) 231-249 and P. E. Childs et al., Journal of Power Sources 3 (1978) 105-114). It has furthermore been described how alumosilicates, zeolites, for example, are also ion conductors (M. S. Wittingham et al., Proceedings of the 7th International Symposium on the Reactivity of Solids, Bristol (July 17-21, 1972) 125-139). In this literature it is also stated that certain solid proton conductors, such as hydrogen uranyl phosphate tetrahydrate, can be used as separators for primary and secondary electrochemical cells, i.e., batteries (P. E. Childs et al., loc. cit.). It has recently been reported by C. M. Johnson et al. (International Conference on Fast Ionic Transport in Solids, Gattlingburgh Tenn. (May 18-22, 1981), that H-zeolites have a proton conductivity which, if wet compacts are used, amounts to $3 \times 10^{-4}$ ohm$^{-1}$·cm$^{-1}$ at 20° C. At the same time it is stated that this proton conductivity is greatest when more water is present than the crystal lattice passages are able to absorb, i.e., when the material is wet. It is stressed, furthermore, that the conductivity in the case of the dry material is very low and increases as the amount of water increases, it being found that the mechanism of the proton conductivity is a conduction process of the Grotthus type (see W. A. England et al., loc. cit.). This is in harmony with the fact that the proton conductivity decreases as drying progresses, i.e., it evidently takes place in the liquid phase, as in a conventional liquid ion conductor.

For the preparation of primary cells or secondary cells and electronic components it is often necessary to put electrolyte between electrodes. In that case the normally used liquid electrolytes are disadvantageous, since they cannot easily be designed as self-supporting constructions and often give rise to corrosion problems. The solid proton conductors that have heretofore been disclosed react like a Bronsted acid and are therefore stable only with a limited number of electrode materials, but not with base metals such as zinc, aluminum, iron and the like, which are frequently used for electrochemical cells. Furthermore, a number of the previously known solid proton conductors are very sensitive to reduction, such as the above-mentioned molybdatophosphoric acid and tungstatophosphoric acid ($H_3X_{12}PO_{40} \cdot 29\ H_2O$, ($H_3O$) $ClO_4$, wherein X represents molybdenum or tungsten). Some materials are radioactive and some contain toxic heavy metal cations ($H_8UO_2IO_6 \cdot 4H_3O$, $Sb_2O_5 \cdot 4H_2O$, $SnO_2 \cdot 2, 3H_2O$ etc.).

With the exception of the likewise proton-conducting beta-aluminum oxide, all materials give off water at low temperatures with a considerable reduction of volume, so that it is not possible to apply thin coatings by deposition from a vapor, sputtering, or the like. Furthermore, sintering of the materials above the dehydrating temperature is not possible. The previously known proton conductors thus contain either expensive or hazardous elements, or they are difficult to prepare. With the exception of beta-aluminum oxide, all materials are extremely soft. Furthermore, most of the previously known solid proton conductors are only two-dimensional proton conductors, which accordingly have anisotropic properties that are important to their use (in regard to mechanical stability, for example). Furthermore, most of the previously known solid proton conductors suffer from the fact that they have an excessively low conductivity (see M. S. Wittingham et al., loc. cit.).

The problem to which the present invention is addressed consists in finding solid proton conductors which even in the dry state have a high conductivity, which can be manufactured simply and cheaply, and which are outstandingly suitable especially as separator material for a great variety of electrochemical purposes.

This problem is now solved by the solid proton conductors of the principal claim. The subordinate claims relate to especially preferred embodiments of this subject matter and the use of these solid proton conductors.

It has been found surprisingly that zeolites which have cations containing protons, and which have six-member and larger rings as secondary structural groups of the zeolitic structure, achieve a high proton conductivity in the mere presence of a purely zeolitic phase, such as zeolitic water. This results in the considerable advantage (chiefly in the case of the basic $NH_4$ zeolites) that no corrosion problems are encountered with respect to materials in contact with these solid proton conductors, so that it becomes possible to prepare batteries or other kinds of electrochemical cells of substantially longer useful life using these solid proton conductors as separator materials.

The subject matter of the invention is therefore solid proton conductors which are characterized by zeolites having proton-containing cations and having six-member and/or larger rings as secondary structural groups of the zeolitic structure, in whose crystal lattice passages a phase is present which promotes proton transport (preferably a polar phase). What is involved, therefore, is open structures (host lattices) which consist predominantly of silicon dioxide and/or aluminum oxide, and which contain a sublattice of the proton-conducting cations, in which the proton-transport-promoting phase is present, which must have a diffusion coefficient of at least $10^{-15}$ cm$^2$·s$^{-1}$. At the same time, at least a certain part of the sub-lattice acts as a Brønsted base with respect to the host lattice.

As regards the definition of the secondary structural groups, reference can be made to R. M. Barrer, "Zeolites and Clay Minerals as Sorbents at Molecular Sieves", Academic Press, London, New York, San Francisco (1978), and F. Schwocho et al., "Zeolithe—Herstellung, Struktur, Anwendung", Angewandte Chemie, 87, Vol. No. 18 (1975), pp. 659-667. These authors state that the different types of structure of the zeolite lattice can best be explained on the basis of eight secondary structural groups comprising the four-member rings (4), six-member rings (6), eight-member rings (8), double four-member rings (4-4), double six-member rings (6-6) and complex or multiple units (4-1, 5-1, 4-4-1).

Now, it has been found that zeolites in accordance with the invention can be those whose zeolitic lattice structure has six-member and/or larger rings as secondary structural groups, as is the case especially with the zeolites of the analcime group, the chabazite group, the phillipsite group and/or the faujasite group. Zeolites that are especially preferred in accordance with the invention are the hydrated forms of analcime, zeolite L, sodalite, phillipsite, gismondine, zeolite A, zeolite X, zeolite Y, zeolite ZK-5 and zeolite omega.

The proton conductors preferred in accordance with the invention are given in the following table along with the secondary structural groups of the zeolites contained.

|                    | 4 | 6 | 8 | 4-4 | 6-6 | 4-1 | 5-1 | 4-4-1 |
|--------------------|---|---|---|-----|-----|-----|-----|-------|
| K—analcime.nL      | + | + |   |     |     |     |     |       |
| K—phillipsite.nL   | + |   | + |     |     |     |     |       |
| K—gismondine.nL    | + |   | + |     |     |     |     |       |
| K—zeolite omega.nL | + | + |   |     |     |     |     |       |
| K—zeolite L.nL     | + | + |   |     |     |     |     |       |
| K—sodalite.nL      | + | + |   |     |     |     |     |       |
| K—zeolite T.nL     | + | + | + | +   |     |     |     |       |
| K—zeolite Y.nL     | + | + | + | +   |     |     |     |       |
| K—zeolite A.nL     | + | + | + | +   |     |     |     |       |
| K—zeolite ZK-5.nL  | + | + | + |     | +   |     |     |       |

K = $NH_4^+$, $N_2H_5^+$, $H^+$—amine or $H_3O^+$ (exclusively or in addition to other cations)
L = $H_2O$ or low-molecular-weight aliphatic or cycloaliphatic alcohol having no more than 6 carbon atoms.

The solid proton conductors in accordance with the invention contain, in the crystal lattice passages of the zeolite, a mobile phase, namely the phase which promotes proton transport, and the amount of this phase is preferably less than the amount that is necessary in order to fill out the crystal lattice passages of the zeolitic structure that are accessible to the mobile phase. For it has surprisingly been found that a substantially higher conductivity can be achieved if this mobile phase, water for example, is not present in more than the amount necessary to fill the lattice passages completely, as has heretofore been assumed. According to a preferred embodiment of the invention, the phase promoting proton transport is present in an amount that suffices for the forming of a monomolecular layer on the crystallite surfaces of the zeolite. This can be achieved in accordance with the invention by converting the zeolite to the ammonium form and then sintering it at temperatures of 500° to 600° C., in vacuo if necessary, and then bringing it again into equilibrium with the proton-transport-promoting phase.

The solid proton conductors of the invention contain protein-containing cations on the basis of; preferably, ammonia, hydrazine, or cations of an organic amine, preferably of a low-molecular-weight aliphatic, cycloaliphatic or aromatic amine of 1 to 6 carbon atoms, such as methylamine, ethylamine or pyridine, and, as the proton-transport-promoting phase, preferably a polar phase, still more preferably water and/or alcohol. Especially preferred as the proton-transport-promoting phase are, in addition to water, the low-molecular-weight aliphatic alcohols of 1 to 6 carbon atoms, preferably methanol or ethanol. In accordance with the invention it is possible to use the proton-transport-promoting phases individually or in combination. Especially preferred in accordance with the invention is a combination of ammonium ions as proton-containing cation, and water as the proton-transport-promoting phase.

As it is commonly known, zeolites are ion exchangers, so that a series of cations or cation combinations are built into the crystal structure, and are also protons, which as such are not mobile in these lattice structures but are tightly bound to the oxygen atoms with the formation of hydroxyl ions. But if, in accordance with the invention, a basic phase such as ammonia, methylamine etc., is also added to the host lattice, it becomes possible to bind the protons to this phase as proton-containing cations and in this way to transport them, depending on the diffusion coefficient of the basic phase. The proton conduction thus takes place, in the solid proton conductors of the invention, through a translatory movement of protein-containing ions ("the vehicle mechanism") such as $H^3O^+$, $NH_4^+$, $N_2H_5^+$, $H^+$-pyridine, $CH_3NH_3^+$ etc., which can be thought of as being composed of the basic phase (water, ammonia, hydrazine, pyridine, methylamine etc.) used for the formation of the proton-containing cation, and of the proton ($H^+$) transported thereby. If the basic phase is very much smaller than the crystal lattice passages of the zeolite, the mobility can be very low. However, in accordance with the invention it can be considerably increased by the addition of another phase, namely the phase which promotes proton transport, such as water or an alcohol such as methanol, ethanol etc. In this manner it becomes possible in accordance with the invention to form solid proton conductors which have at room temperature a proton conduction of better than $10^{-3}$ ohms$^{-1}$·cm$^{-1}$.

It has furthermore been found that the solid proton conductors of the invention, on account of their very low necessary water content and their basic behavior, create no corrosion problems with the electrodes in contact with them, so that they are outstandingly suitable as-separator material or electrolyte for primary or secondary electrolysis cells, electrochromic displays, electronic storage elements (such as timers and memory elements) and the like. In particular they can be used to advantage whenever a high proton conductivity is needed plus a high diffusion coefficient, for metal/air cells for example. Therefore, the use of the solid proton conductors of the invention in accordance with claim 12 is also subject matter of the invention.

The following example will serve for the further explanation of the invention.

EXAMPLE 5 g of a zeolite of type A, of the approximate composition $Na_4Ca_4Al_{12}Si_{12}O_{48}$ (pseudocubic, a=1.242 nm, Linde molecular sieve 5 A) is added to 250 ml of an aqueous saturated ammonium carbonate solution. In the course of an exothermic reaction, with constant stirring overnight, approximately 50% of the sodium ions are exchanged for ammonium ions and approximately 14.5% of water, by weight, is absorbed. The reaction product (of the approximate composition $(NH_4)_a Na_{2-}Ca_2Al_{12}Si_{12}O_{48}\cdot nH_2O$) is removed by filtration, air dried, and stored above water at room temperature. The material has a conductivity at room temperature of $2\times10^{-3}$ ohm$^{-1}$·cm$^{-1}$ and can very easily be pressed in an excess of water, alcohol or the like.

The material can be sintered at 300° C. with the loss of water. If an equilibrium is brought about at room temperature over water, the proton conductivity of the starting material is restored.

If the material is sintered at 600° C. with the loss of water and ammonia, relatively abrasion-resistant bodies are obtained, which are far more stable mechanically than those made by sintering at 300° C. Then, thin coatings (e.g., $MoO_3$, $WO_3$ etc.) can be applied to them non-destructively by deposition from a vapor, sputtering, etc. In this manner disks are obtained (with a diameter of 25 mm and a thickness of 1 mm), which, in a repeatable manner, have an electrolyte resistance of 11 ohms.

If these disks are used together with a pair of electrodes of manganese dioxide (with a graphite content of 8%) and iron, a cell is obtained having a cell voltage of 0.7 to 1.2 volts and a short-circuit current of 60 µA, which is reversible and can be operated for very long periods with only a slight voltage loss.

By applying the measures described above, but using methylamine, methanol and ethanol, and using different zeolite host lattices, the following proton conductors are obtained:

|  | $\Sigma$ [ohm$^{-1}$/cm$^{-1}$] | wt % H$_2$O |
|---|---|---|
| NH$_4$—analcime.H$_2$O | $2 \times 10^{-4}$ | 6.5 |
| NH$_4$—phillipsite.nH$_2$O | $7 \times 10^{-5}$ | 20 |
| NH$_4$—gismondine.nH$_2$O | $8 \times 10^{-5}$ | 16 |
| NH$_4$—sodalite.nH$_2$O | $2 \times 10^{-4}$ | 24.5 |
| NH$_4$—zeolite L.nH$_2$O | $5 \times 10^{-5}$ | 13.5 |
| NH$_4$—zeolite $\Omega$.nH$_2$O | $5 \times 10^{-4}$ | 24 |
| NH$_4$—zeolite A.nH$_2$O | $2 \times 10^{-3}$ | 14.5 |
| CH$_3$NH$_3$—zeolite A.nH$_2$O | $7 \times 10^{-5}$ | 13.5 |
| NH$_4$—zeolite A.nCH$_3$OH | $1.3 \times 10^{-4}$ | — |
| NH$_4$—zeolite A.nC$_2$H$_5$OH | $1.5 \times 10^{-4}$ | — |
| NH$_4$—zeolite X.nH$_2$O | $1 \times 10^{-3}$ | 32 |
| NH$_4$—zeolite Y.nH$_2$O | $1 \times 10^{-3}$ | 31 |
| NH$_4$—zeolite ZK-5 | $8 \times 10^{-4}$ | 15 |
| H—zeolite A.nH$_2$O | $6 \times 10^{-7}$ | 13.5 |

We claim:

1. A solid proton conductor comprising zeolites having proton-containing cations and having six-membered rings and/or larger rings as secondary structural groups of the zeolithic structure, and having in the crystal lattice passages of said zeolites, a phase which promotes proton transport and wherein the zeolite is a zeolite of the analcime group, the chabazite group, the phillipsite group and/or the faujasite group.

2. The proton conductor of claim 1, wherein the phase which promotes proton transport is a polar phase.

3. The proton conductor of claim 1 or 2, wherein the phase which promotes proton transport is present in an amount which in addition to filling the lattice passages forms a monomolecular layer on the crystal surfaces.

4. The proton conductor of claim 1 or 2, wherein the phase which promotes proton transport is present in an amount that is less than the amount necessary for the filling of the crystal lattice passages of the zeolitic structure which are accessible for this phase.

5. The proton conductor of claim 1 wherein the phase promoting proton transport has a diffusion coefficient of at least $10^{-15}$ cm$^2 \cdot$s$^{-1}$.

6. The proton conductor of claim 1 wherein the zeolite has ammonium cations (NH$_4^+$), hydronium cations (H$_3$O$^+$), hydrazinium cations (N$_2$H$_5^+$) or organic amine cations as proton-containing cations.

7. The proton conductor of claim 6 wherein the organic amine cation is a cation on the basis of at least one aliphatic, cycloaliphatic or aromatic amine of low molecular weight having 1 to 6 carbon atoms.

8. The proton conductor of claim 1 wherein the zeolite contains water, dimethylsulfoxide and/or an alcohol as the phase which promotes proton transport.

9. The proton conductor of claim 8, wherein the zeolite contains as alcohol at least one aliphatic alcohol of low molecular weight having 1 to 6 carbon atoms.

10. The proton conductor of claim 1, containing as zeolite: analcime, zeolite L, sodalite, phillipsite, gismondine, zeolite A, zeolite X, zeolite Y, zeolite ZK-5 and/or zeolite omega.

11. The proton conductor of claim 7 wherein the organic amine cation is based on methylamine, ethylamine or pyridine.

12. The proton conductor of claim 1 further comprising a pair of electrodes, said zeolites being disposed between said electrodes.

* * * * *